United States Patent
Yu et al.

(10) Patent No.: US 9,362,176 B2
(45) Date of Patent: Jun. 7, 2016

(54) UNIFORM EXPOSED RAISED STRUCTURES FOR NON-PLANAR SEMICONDUCTOR DEVICES

(71) Applicant: GLOBALFOUNDRIES Inc., Grand Cayman (KY)

(72) Inventors: Hong Yu, Rexford, NY (US); HongLiang Shen, Ballston Lake, NY (US); Zhao Lun, Ballston Lake, NY (US); Zhenyu Hu, Clifton Park, NY (US); Richard J. Carter, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/319,640

(22) Filed: Jun. 30, 2014

(65) Prior Publication Data
US 2015/0380316 A1    Dec. 31, 2015

(51) Int. Cl.
*H01L 21/8234* (2006.01)
*H01L 27/088* (2006.01)
*H01L 29/06* (2006.01)
*H01L 21/762* (2006.01)
*H01L 21/306* (2006.01)

(52) U.S. Cl.
CPC .. *H01L 21/823481* (2013.01); *H01L 21/30604* (2013.01); *H01L 21/762* (2013.01); *H01L 21/823431* (2013.01); *H01L 27/0886* (2013.01); *H01L 29/0653* (2013.01)

(58) Field of Classification Search
CPC ............... H01L 21/823431; H01L 21/823821; H01L 21/845; H01L 27/0886; H01L 27/10826; H01L 29/41791; H01L 21/762
USPC .......... 257/288, 368, 369, 374, 510; 438/151, 438/197, 199, 248, 391, 424
See application file for complete search history.

(56) References Cited

U.S. PATENT DOCUMENTS

| | | | |
|---|---|---|---|
| 9,048,259 B2 * | 6/2015 | Hung | H01L 29/66795 |
| 2014/0051227 A1 * | 2/2014 | Jakubowski | H01L 21/31116 438/424 |
| 2014/0264522 A1 * | 9/2014 | Chan | H01L 21/84 257/301 |

* cited by examiner

*Primary Examiner* — Jarrett Stark
*Assistant Examiner* — Shahed Ahmed
(74) *Attorney, Agent, or Firm* — Wayne F. Reinke, Esq.; Heslin Rothenberg Farley & Mesiti P.C.

(57) ABSTRACT

The use of two different materials for shallow trench isolation and deep structural trenches with a dielectric material therein (e.g., flowable oxide and a HARP oxide, respectively) causes non-uniform heights of exposed portions of raised semiconductor structures for non-planar semiconductor devices, due to the different etch rates of the materials. Non-uniform openings adjacent the exposed portions of the raised structures from recessing the isolation and dielectric materials are filled with additional dielectric material to create a uniform top layer of one material (the dielectric material), which can then be uniformly recessed to expose uniform portions of the raised structures.

4 Claims, 3 Drawing Sheets

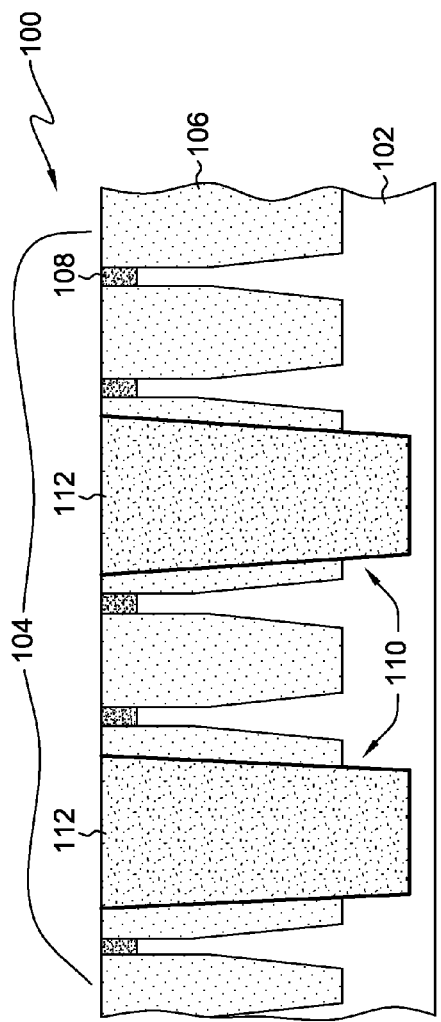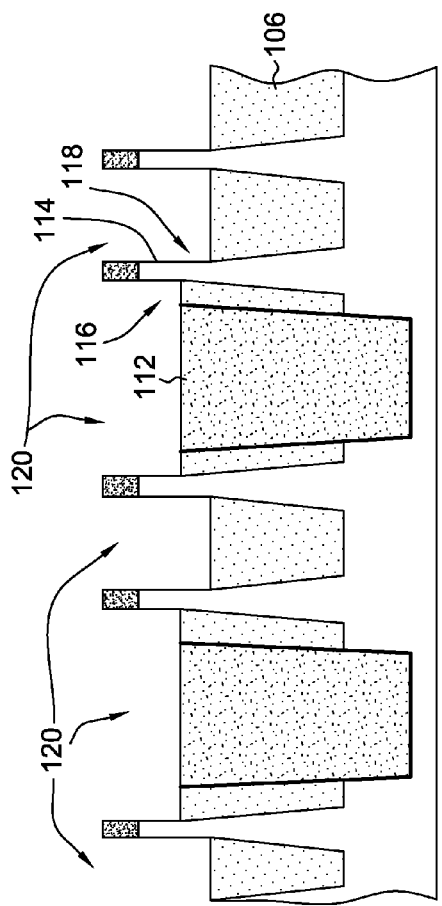

UNIFORM EXPOSED RAISED STRUCTURES FOR NON-PLANAR SEMICONDUCTOR DEVICES

BACKGROUND OF THE INVENTION

1. Technical Field

The present invention generally relates to non-planar semiconductor structures, and, more particularly, to uniformity among exposed portions of raised structures for non-planar semiconductor devices.

2. Background Information

In the fabrication of non-planar semiconductor devices, for example, FinFETs (transistors with raised structures resembling fins on a bulk substrate), a layer of isolation material surrounds the fins. Flowable oxide deposited by Chemical Vapor Deposition (CVD) is typically used as the isolation material, as it has a superior filling capability. Also included are deep trenches into the bulk substrate filled with an oxide deposited by a High Aspect Ratio Process (HARP), which involves using $O_3$ in the presence of tetraethyl orthosilicate (TEOS). However, the flowable oxide and HARP oxide have different etch rates, resulting in a non-uniform or unsymmetrical fin profile, which affects device performance and causes other downstream fabrication problems.

Therefore, a need exists for more uniform profiles of exposed portions of raised structures in the fabrication of non-planar semiconductor devices.

SUMMARY OF THE INVENTION

The shortcomings of the prior art are overcome and additional advantages are provided through the provision, in one aspect, of a method of fabricating uniform exposed portions of raised semiconductor structures for non-planar semiconductor devices. The method includes providing a starting non-planar semiconductor structure, the structure including a semiconductor substrate, a plurality of raised semiconductor structures coupled to the substrate and covered with a protective material, an isolation material surrounding the raised structures, and at least one trench through the non-planar structure and into the substrate filled with a dielectric material different than the isolation material. The isolation material has a different etch rate than the dielectric material for a given etch. The method further includes replacing a top portion of the layer of isolation material with the dielectric material to create a uniform top layer of the dielectric material, and recessing the uniform top layer to expose uniform portions of the raised structures.

In accordance with another aspect, a non-planar semiconductor structure is provided. The structure includes a semiconductor substrate, a plurality of raised semiconductor structures coupled to the substrate, a non-uniform layer of isolation material surrounding bottom portions of the plurality of raised semiconductor structures, at least one trench through the non-planar structure and into the substrate, the at least one trench filled with only a dielectric material different from the isolation material and having a different etch rate than the isolation material for a given etch. A top layer of the dielectric material is situated above the non-uniform layer of isolation material and in the at least one trench, and a top surface of the top layer has a uniform height below uniform exposed portions of the plurality of raised semiconductor structures.

These, and other objects, features and advantages of this invention will become apparent from the following detailed description of the various aspects of the invention taken in conjunction with the accompanying drawings.

BRIEF DESCRIPTION OF THE DRAWINGS

FIG. 1 is a cross-sectional view of one example of a starting non-planar semiconductor structure, the structure including a substrate and multiple raised semiconductor structures coupled to the substrate, the raised structures being surrounded by a layer of isolation material and covered with a hard mask, the structure further including deep trenches filled with a dielectric material different than the isolation material, in accordance with one or more aspects of the present invention.

FIG. 2 depicts one example of the non-planar structure of FIG. 1 after recessing the isolation layer and the dielectric material, exposing a non-uniform portion of the raised structures, in accordance with one or more aspects of the present invention.

DETAILED DESCRIPTION OF THE INVENTION

Figure 3:
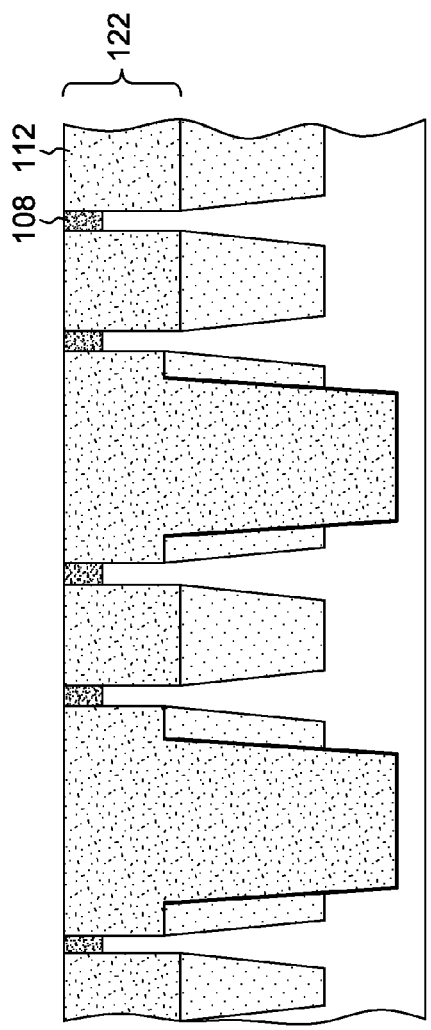
FIG. 3 depicts one example of the non-planar structure of FIG. 2 after filling openings created by the recessing with more of the dielectric material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting non-planar semiconductor structure 100, the structure including a substrate 102 and multiple raised semiconductor structures 104 coupled to the substrate, the raised structures being surrounded by a layer of isolation material 106 and covered with a protective material 108 (e.g., a hard mask), the structure further including deep trenches 110 filled with a dielectric material 112 different than the isolation material, in accordance with one or more aspects of the present invention. The isolation material may be, for example, a flowable oxide, deposited, e.g., using Chemical Vapor Deposition (CVD), the dielectric material may be, for example, a HARP oxide, and the protective material may be, for example, silicon nitride (SiN).

The starting structure may generally be conventionally fabricated, for example, using known processes and techniques. For example, after filling the trenches with HARP oxide, the structure would be annealed and the HARP oxide planarized using, for example, a chemical-mechanical polishing (CMP) technique. However, it will be understood that the fabrication of the starting structure forms no part of the present invention. Further, although only a portion of the overall structure is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, raised structures 104 may take the form of "fins." The raised structure(s) may, for example, be etched from a bulk substrate, and may include, for example, any of the materials listed above with respect to the substrate. Further, some or all of the raised structure(s) may include added impurities (e.g., by doping), making them n-type or p-type.

FIG. 2 depicts one example of the non-planar structure of FIG. 1 after recessing the isolation material 106 and the dielectric material 112, exposing a non-uniform portion of the raised structures, for example, raised structure 114 has less of side 116 exposed than side 118, in accordance with one or more aspects of the present invention.

Recessing the isolation material and the dielectric material may be done, for example, with one or more etching processes. In one example, a series of three processes are performed to remove the isolation and dielectric materials—a reactive ion etch, followed by a Chemical Oxide Removal (COR) process and ending with a SiCoNi dry etch. In another example, a single SiCoNi dry etch may be used for a longer time.

FIG. 3 depicts one example of the non-planar structure of FIG. 2 after filling openings (120, FIG. 2) created by the recessing with more of the dielectric material 112, creating a top layer 122 of the dielectric material, in accordance with one or more aspects of the present invention. The filling of the openings may be accomplished, for example, with a CVD process, and may be followed by an anneal in an atmosphere of nitrogen gas at a temperature of about 1050° for about 20 minutes to about 50 minutes. Further, the anneal may be followed by planarizing, for example, using CMP and stopping on the protective material 108 above the raised structures.

Figure 4:
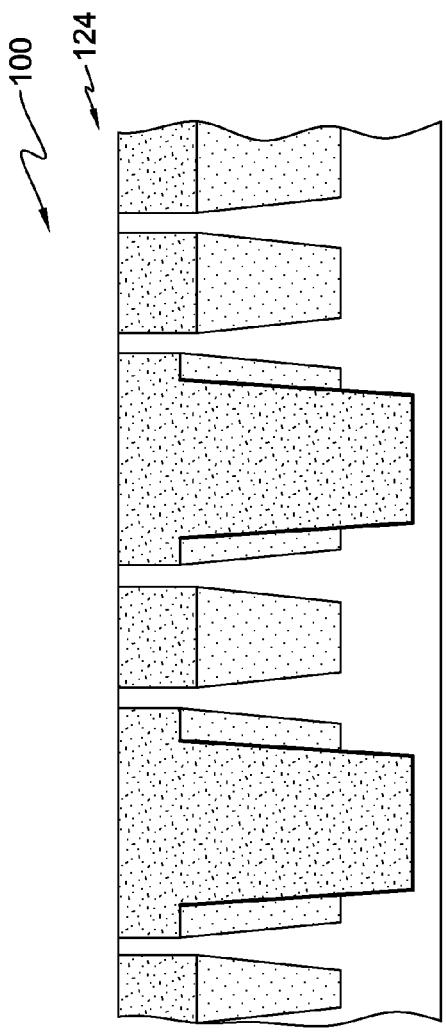
FIG. 4 depicts one example of the non-planar structure of FIG. 3 after removal of the hard mask over the raised structures and planarizing a top surface of the non-planar structure, in accordance with one or more aspects of the present invention.

FIG. 4 depicts one example of the non-planar structure of FIG. 3 after removal of the protective material (108, FIG. 3) and planarizing a top surface 124 of the non-planar structure 100, in accordance with one or more aspects of the present invention.

Removal of the protective material over the raised structures and planarizing may be accomplished by, for example, a deglaze process followed by a strip process. In one example, where the protective material includes silicon nitride, the deglaze process may take the form of a wet etch using, e.g., hydrofluoric acid, which removes the isolation material, and the strip process may take the form of a wet etch using $H_3PO_4$ (Phosphoric Acid), which is selective to nitrogen.

Figure 5:
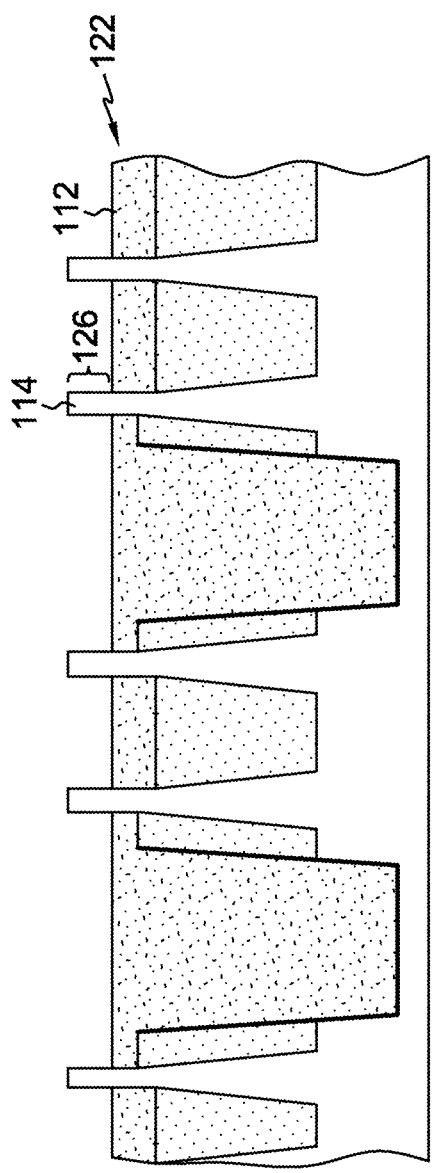
FIG. 5 depicts one example of the non-planar structure of FIG. 4 after recessing of the added dielectric material, exposing a uniform portion of the raised structures, in accordance with one or more aspects of the present invention.

FIG. 5 depicts one example of the non-planar structure of FIG. 4 after recessing the top layer 122 of the dielectric material 112, exposing a uniform portion of the raised structures (e.g., portion 126 of raised structure 114), in accordance with one or more aspects of the present invention. Recessing of the top layer of dielectric material may be accomplished, for example, in the same manner as described above with respect to the recess of FIG. 2.

In a first aspect, disclosed above is a method of fabricating uniform exposed portions of raised semiconductor structures for non-planar semiconductor devices. The method includes providing a starting non-planar semiconductor structure, the structure including a semiconductor substrate, multiple raised semiconductor structures coupled to the substrate and covered with a protective material, for example, a hard mask (e.g., silicon nitride), an isolation material (e.g., a flowable oxide) surrounding the raised structures, and at least one trench through the non-planar structure and into the substrate filled with a dielectric material that is different from the isolation material (e.g., a HARP oxide). The isolation material also has a different etch rate than the dielectric material for a given etch. The method further includes replacing a top portion of the layer of isolation material with additional dielectric material to create a uniform top layer of the dielectric material, and recessing the uniform top layer to expose uniform portions of the raised structures.

The replacing of a portion of the isolation material in the method of the first aspect may include, for example, recessing the layer of isolation material and the dielectric material to expose non-uniform portions of the raised structures, the recessing creating non-uniform openings, and filling the non-uniform openings with the additional dielectric material to create the uniform top layer of the dielectric material. In one example, the recessing may include recessing about 80 nm to about 100 nm below a top surface of the protective material covering the raised structures.

The method of the first aspect may further include, for example, after the replacing and before the recessing, removing the protective material covering the raised structures, and planarizing the non-planar structure.

In a second aspect, disclosed above is a non-planar semiconductor structure. The structure includes a semiconductor substrate (e.g., a bulk semiconductor substrate), multiple raised semiconductor structures coupled to the substrate, a non-uniform layer of isolation material between adjacent raised structures, at least one trench through the non-planar structure and into the substrate, the trench(es) filled with a dielectric material different from the isolation material and having a different etch rate than the isolation material for a given etch, and a top layer of the dielectric material above the non-uniform layer of isolation material and in the trench(s). A top surface of the top layer has a uniform height below uniform exposed portions of the raised semiconductor structures.

A height of the uniform exposed portions of the non-planar semiconductor structure of the second aspect may be, for example, about 40 nm to about 60 nm.

The isolation material of the non-planar semiconductor structure of the second aspect may include, for example, flowable oxide, and the dielectric material may include, for example, a HARP oxide.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A non-planar semiconductor structure, comprising:
a semiconductor substrate;
a plurality of raised semiconductor structures coupled to the substrate, a non-uniform layer of isolation material surrounding bottom portions of the plurality of raised semiconductor structures;
at least one trench through the non-planar structure and into the substrate, the at least one trench filled with only a dielectric material different from the isolation material and having a different etch rate than the isolation material for a given etch; and
wherein a top layer of the dielectric material is situated above the non-uniform layer of isolation material and in the at least one trench, and wherein a top surface of the top layer has a uniform height below uniform exposed portions of the plurality of raised semiconductor structures.

2. The non-planar semiconductor structure of claim 1, wherein a height of the uniform exposed portions is about 40 nm to about 60 nm.

3. The non-planar semiconductor structure of claim 1, wherein the isolation material comprises flowable oxide, and wherein the dielectric material comprises a HARP oxide.

4. The non-planar semiconductor structure of claim 1, wherein the top layer of the dielectric material is wider in cross-section taken through the plurality of raised semiconductor structures, than a remainder of the dielectric material therebelow.

* * * * *